(12) United States Patent
Lv

(10) Patent No.: US 10,403,220 B2
(45) Date of Patent: Sep. 3, 2019

(54) GOA CIRCUIT, DRIVING METHOD, AND DISPLAY PANEL

(71) Applicant: Shenzhen China Star Optoelectronics Semiconductor Display Technology Co., Ltd., Shenzhen, Guangdong (CN)

(72) Inventor: Xiaowen Lv, Guangdong (CN)

(73) Assignee: Shenzhen China Star Optoelectronics Semiconductor Display Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 15/558,547

(22) PCT Filed: Aug. 21, 2017

(86) PCT No.: PCT/CN2017/098258
§ 371 (c)(1),
(2) Date: Sep. 14, 2017

(87) PCT Pub. No.: WO2019/010754
PCT Pub. Date: Jan. 17, 2019

(65) Prior Publication Data
US 2019/0019469 A1 Jan. 17, 2019

(30) Foreign Application Priority Data
Jul. 12, 2017 (CN) .......................... 2017 1 0565257

(51) Int. Cl.
*G09G 3/36* (2006.01)
*G11C 19/28* (2006.01)
*G11C 7/20* (2006.01)

(52) U.S. Cl.
CPC ......... *G09G 3/3677* (2013.01); *G09G 3/3696* (2013.01); *G09G 2300/0408* (2013.01); *G09G 2310/0286* (2013.01); *G09G 2320/0223* (2013.01); *G11C 7/20* (2013.01); *G11C 19/28* (2013.01)

(58) Field of Classification Search
CPC ............... G09G 3/3677; G09G 3/3696; G09G 2310/0286; G09G 2300/0408; G09G 2320/0223; G11C 7/20; G11C 19/28
See application file for complete search history.

(56) References Cited

U.S. PATENT DOCUMENTS

2003/0179161 A1 9/2003 Yamamoto
2016/0343335 A1* 11/2016 Cao ........................ G09G 3/36
(Continued)

FOREIGN PATENT DOCUMENTS

CN 106486085 A 3/2007
CN 101383133 A 3/2009
(Continued)

*Primary Examiner* — Abhishek Sarma
(74) *Attorney, Agent, or Firm* — Andrew C. Cheng

(57) ABSTRACT

The present disclosure is about a Gate Driver on Array (GOA) circuit, its driving method, and a display panel employing the circuit. The GOA circuit has a node between its pull-up control circuit and pull-up circuit where a reference voltage is introduced. A reset circuit has its input terminal connected to the node, its output terminal connected to the reference voltage and its control terminal is applied an activation signal STV at the instant when the display panel is shutdown so as to bring down the node's level.

3 Claims, 2 Drawing Sheets

(56) References Cited

U.S. PATENT DOCUMENTS

2017/0032750 A1* 2/2017 Shao ................... G09G 3/3648
2017/0186393 A1* 6/2017 Wang ...................... G09G 3/36
2017/0270879 A1* 9/2017 Han ..................... G09G 3/3648

FOREIGN PATENT DOCUMENTS

CN          104700789 A      6/2015
CN          106328084 A      1/2017

* cited by examiner

GOA CIRCUIT, DRIVING METHOD, AND DISPLAY PANEL

BACKGROUND OF THE INVENTION

1. Field of the Invention

The present disclosure generally relates to display driving techniques, and particularly relates to a Gate Driver on Array (GOA) circuit, its driving method, and a display panel employing the circuit and method.

2. The Related Arts

According to Gate Driver on Array (GOA) technique, the driving circuits for scan lines are positioned on the substrate around the active area of liquid crystal display (LCD) panel, thereby omitting the use of an external Integrated Circuit (IC). GOA not only reduce the overhead of bonding the external IC, but also facilitate the design of narrow-border or no-border LCD panel.

Currently, a GOA circuit for a scan line mainly includes a pull-up circuit, a pull-up control circuit, and a pull-down circuit. A reference voltage is introduced between the pull-up circuit and the pull-up control circuit at the so-called Q node. To ensure that the LCD panel may be properly started after abnormal shutdown, the GOA circuit should completely discharge the electric charge at the Q node when the LCD panel is abnormally shutdown. Existing approach is to raise the reference voltage such as VSS (Voltage Series, or common ground voltage) at the instant of shutdown to achieve the complete discharge. However, it needs time to raise the voltage to a high level, and the amount of time required has to be specially engineered according to the overall driving system of the LCD panel. This is a difficult task, and some driving system may not be compatible with this approach.

SUMMARY OF THE INVENTION

Therefor the present disclosure teaches a Gate Driver on Array (GOA) circuit, its driving method, and a display panel including the GOA circuit capable of achieving full discharge to the GOA circuit.

An embodiment of the GOA circuit for a display panel includes a pull-up control circuit, a pull-up circuit, and a reset circuit. A reference voltage is introduced to a node between the pull-up control circuit and the pull-up circuit. The reset circuit has its input terminal connected to the node, its output terminal connected to the reference voltage and its control terminal is applied a first activation signal STV at the instant when the display panel is shutdown so as to bring down the node's level.

An embodiment of the display panel includes a GOA circuit. The GOA circuit includes a pull-up control circuit, a pull-up circuit, and a reset circuit. A reference voltage is introduced to a node between the pull-up control circuit and the pull-up circuit. The reset circuit has its input terminal connected to the node, its output terminal connected to the reference voltage and its control terminal is applied a first activation signal STV at the instant when the display panel is shutdown so as to bring down the node's level.

An embodiment of the driving method for a GOA circuit of a display panel where the GOA circuit includes a pull-up control circuit and a pull-up circuit, and a reference voltage is introduced to a node between the pull-up control circuit and the pull-up circuit, includes the steps of:

providing a reset circuit whose input terminal is connected to the node; and connecting the reset circuit's output terminal to the reference voltage and, at the instant when the display panel is shutdown, applying a first activation signal to the control terminal of the reset circuit so as to bring down the node's level.

The advantage of the present disclosure is as follows. Since the STV signal applied at the instant when the display panel is shutdown is at a high level originally, the present disclosure achieves the complete discharge to the GOA circuit in a simpler manner without worrying about the time required to raise reference voltage VSS, and may prevent any residual charge at the Q node to cause abnormal start of the display panel.

BRIEF DESCRIPTION OF THE DRAWINGS

To make the technical solution of the embodiments according to the present disclosure, a brief description of the drawings that are necessary for the illustration of the embodiments will be given as follows. Apparently, the drawings described below show only example embodiments of the present disclosure and for those having ordinary skills in the art, other drawings may be easily obtained from these drawings without paying any creative effort. In the drawings.

DETAILED DESCRIPTION OF THE PREFERRED EMBODIMENTS

In the following, the present disclosure is explained in details through embodiments and accompanying drawings. It should be understood that not all possible embodiments are disclosed. Other embodiments derived or combined from the following embodiments by a reasonably skilled person in the art without significant inventive effort should be considered to be within the scope of the present disclosure.

Figure 1:
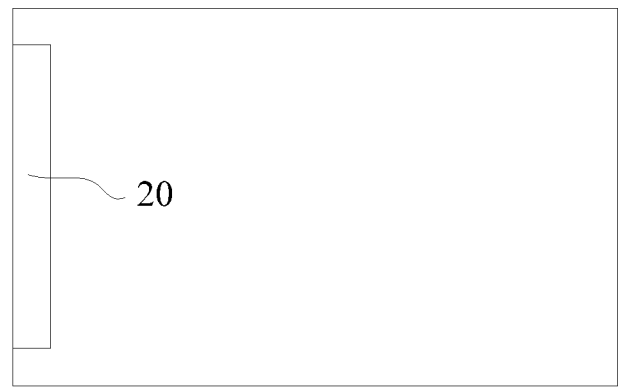
FIG. 1 is a schematic diagram showing a display panel according to an embodiment of the present disclosure.

As shown in FIG. 1, a display panel 10 according to an embodiment of the present disclosure has a GOA circuit 20 outside the active area of the display panel 10. The GOA circuit 20 may be formed on the array substrate or the color film substrate of the display panel 10. Since the GOA circuit 20 includes a number of identical units, one for each scan line, the present disclosure uses the driving unit for the $n^{th}$-stage scan line Gn as an example of the GOA circuit 20.

Figure 2:
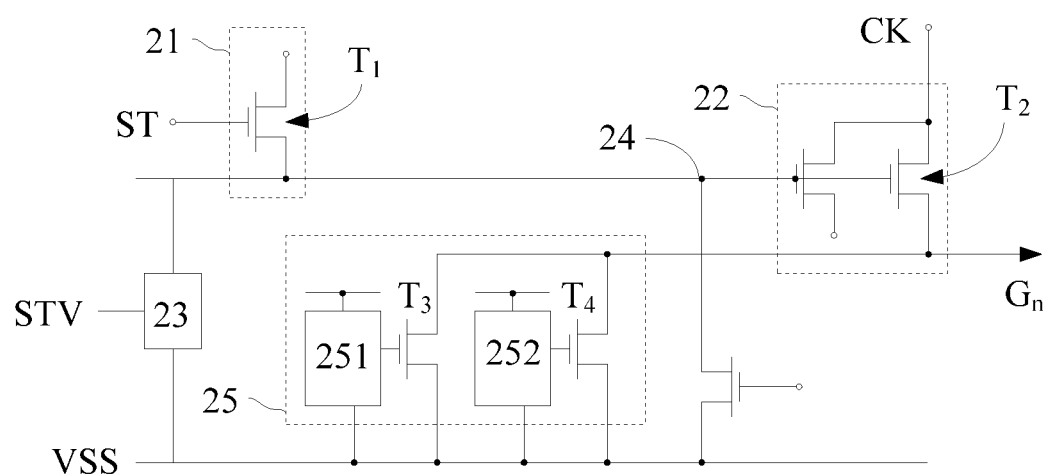
FIG. 2 is a schematic diagram showing a GOA circuit according to an embodiment of the present disclosure.

As shown in FIG. 2, the GOA circuit 20 includes a pull-up control circuit 21, a pull-up circuit 22, and a reset circuit 23. A node 24 (i.e., Q node) is between the pull-up control circuit 21 and the pull-up circuit 22, where a reference voltage such as VSS may be introduced. The reset circuit 23 has an input terminal connected to the node 24, an output terminal connected to the reference voltage VSS, and a control terminal is connected to an IC (not shown) outside the active area of the display panel 10.

Specifically, the pull-up control circuit includes a first switch T1 and the pull-circuit 22 includes a second switch T2. The first switch T1 has a control terminal (i.e., gate) receiving ST signal (i.e., cyclic activation input signal), an input terminal (i.e., source) receiving output signal from the scan line of a previous stage, and an output terminal (i.e., drain) connecting a control terminal of the second switch T2. The second switch T2 has an input terminal receiving CK signal (i.e., clock signal), and an output terminal sending driving signal to the scan line Gn of the present stage. The output terminal of the second switch T2 is the GOA circuit 20's output terminal. The node 24 is located between the output terminal of the first switch T1 and the control terminal of the second switch T2.

Figure 3:
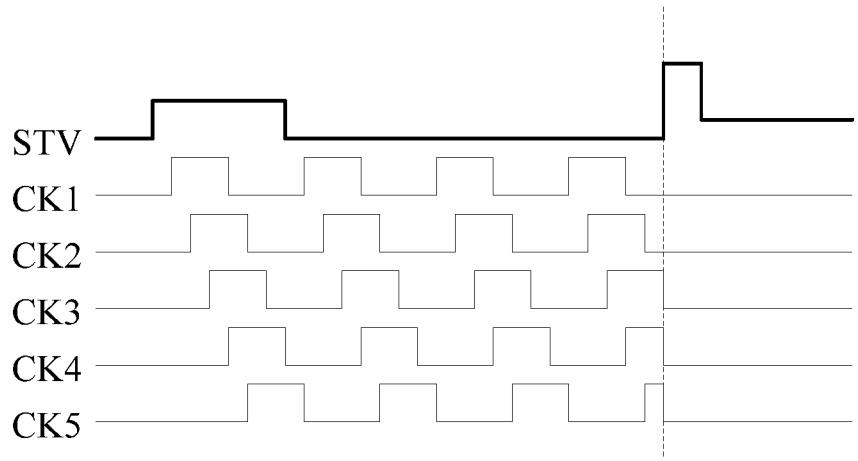
FIG. 3 is a timing diagram of various signals involved in the present disclosure.

As also shown in FIG. 3, when the display panel 10 shows a frame, the IC outside the active area of the display panel 10 sends ST signal to the control terminal of the first switch T1, and CK signal to the input terminal of the second switch T2. The ST and CK signals are both at a high level. The first and second switches T1 and T2 are conducted. The pull-up circuit 22 sends driving signal to the scan line Gn according to the CK signal.

At the instant when the display panel 10 is shutdown, the IC stops sending ST signal to the pull-up control circuit 21, and CK signal to the pull-up circuit 22. The ST and CK signals are both at a low level. The first and second switches T1 and T2 are cut off. The IC applies STV signal (activation signal) to the control terminal of the reset circuit 23, thereby connecting the node 24 to the reference voltage VSS through the reset circuit 23. VSS is at a low level. The node 24 at the instant is at a high level. Therefore electric charges at the node 24 move towards VSS. No residual charges remains at the node 24, complete discharge of the GOA circuit 20 is achieved, and abnormal start of the display panel 10 is prevented.

Since STV signal functions as the activation signal to the scan lines, it is at a high level originally. Compared to the prior art which fulfills complete discharge through raising the reference voltage VSS, the present disclosure achieves the complete discharge to the GOA circuit 20 in a simpler manner without worrying about the time required to raise VSS, and may be applied to display panels 10 employing different kinds of driving systems.

In the present embodiment, the STV signal applied to the reset circuit 23 at the instant of the display panel 10's shutdown (deemed as a first activation signal STV) may be different from the STV signal applied to the GOA circuit 20 when the display panel 10 normally displays an image (deemed as a second activation signal STV). Specifically, the first activation signal STV has a higher level than that of the second activation signal STV, so that the first activation signal STV may deplete the electric charges at the node 24 more quickly. In addition, since the node 24's discharge period is smaller than the period for displaying a frame of image, the first activation signal STV is applied for a shorter period than that of the second activation signal STV.

In other words, the present disclosure fulfills the complete discharge of the node 24 by applying the activation signal STV to the reset circuit 23 at the instant of display panel 10's shutdown. Therefore, the present disclosure may be applied to other types of GOA circuits 20. For example, the GOA circuit 20 may include a pull-down circuit 25, which in turn includes a first pull-down control circuit 251, a second pull-down control circuit 252, a first pull-down switch T3, and a second pull-down switch T4. The first and second pull-down switches T3 and T4 may be thin film transistors (TFTs), and the first, control, and second terminals of the first and second pull-down switches T3 and T4 are the TFT's sources, gates, and drains. The first pull-down switch T3 has its gate connected to the first pull-down control circuit 251, its source connected to the output terminal of the GOA circuit 20, and its drain connected to the reference voltage VSS. The second pull-down switch T4 has its gate connected to the second pull-down control circuit 252, its source connected to the output terminal of the GOA circuit 20, and its drain connected to the reference voltage VSS. When the STV signal is applied to the reset circuit 23 at the instant of display panel 10's shutdown, the first and second pull-down control circuits 251 and 252 conduct the first and second pull-down switches T3 and T4, and the output terminal of the GOA circuit 20 is connected to the reference voltage VSS. The reset circuit 23 may also be designed accordingly. For example, the reset circuit 23 may include a TFT and the reset circuit 23's control terminal, input terminal, and output terminal are the TFT's gate, source, and drain, respectively.

Figure 4:
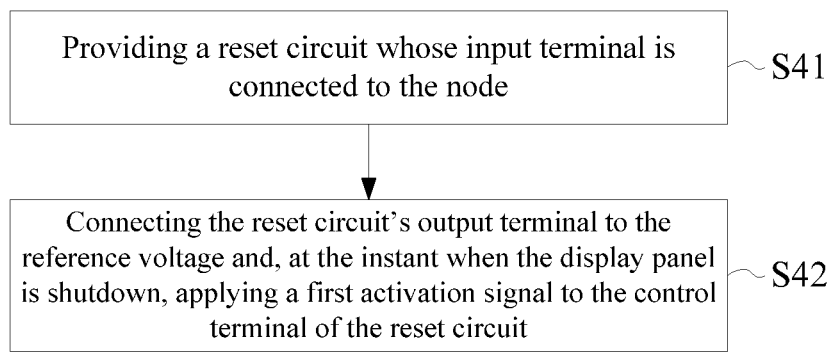
FIG. 4 is a flow diagram showing a method for driving GOA circuit according to an embodiment of the present disclosure.

The present disclosure also provides a GOA circuit driving method applicable to a GOA circuit having a pull-up control circuit, a pull-up circuit, and a node between the pull-up control circuit and the pull-up circuit where a reference voltage is introduced. As shown in FIG. 4, the driving method includes the following steps S41 and S42.

In step S41, a reset circuit is provided whose input terminal is connected to the node.

In step S42, the output terminal of the reset circuit is connected to the reference voltage and, at the instant when the display panel is shutdown, an activation signal STV is applied to the control terminal of the reset circuit so as to bring down the node's level.

The above reset circuit may be designed identically to the reset circuit 23 shown in FIG. 2. The principle and operation of the method may be referred to the earlier description, and the driving circuit and method enjoy the same advantages.

Embodiments of the present disclosure have been described, but not intending to impose any unduly constraint to the appended claims. Any modification of equivalent structure or equivalent process made according to the disclosure and drawings of the present disclosure, or any application thereof, directly or indirectly, to other related fields of technique, is considered encompassed in the scope of protection defined by the claims of the present disclosure.

What is claimed is:

1. A display panel comprising a Gate Driver on Array (GOA) circuit wherein the GOA circuit comprises a pull-up control circuit, a pull-up circuit, and a reset circuit wherein a reference voltage is introduced to a node between the pull-up control circuit and the pull-up circuit; the reset circuit has its input terminal connected to the node, its output terminal connected to the reference voltage, and its control terminal applied a first activation signal STV at the instant when the display panel is shutdown so as to bring down a node's level, the first activation signal STV has a higher level than that of a second activation signal STV applied to the GOA circuit when the display panel normally displays an image, wherein the first activation signal STV is applied for a shorter period than that of a second activation signal STV applied to the GOA circuit when the display panel normally displays an image, wherein an output terminal of the GOA circuit delivers a driving signal for a scan line; the GOA circuit further comprises a first pull-down control circuit, a second pull-down control circuit, a first pull-down switch, and a second pull-down switch; the first and second pull-down switches have their first terminals connected to the output terminal of the GOA circuit; the first pull-down switch has its control terminal connected to the first pull-down control circuit; the second pull-down switch has its control terminal connected to the second pull-down control circuit; the first and second pull-down switches have their second terminals connected to the reference voltage.

2. A Gate Driver on Array (GOA) circuit for a display panel comprising a pull-up control circuit, a pull-up circuit, and a reset circuit wherein a reference voltage is introduced to a node between the pull-up control circuit and the pull-up circuit; the reset circuit has its input terminal connected to the node, its output terminal connected to the reference voltage, and its control terminal applied a first activation signal STV at the instant when the display panel is shutdown so as to bring down a node's level, wherein the first activation signal STV is applied for a shorter period than that of a second activation signal STV applied to the GOA circuit when the display panel normally displays an image, wherein an output terminal of the GOA circuit delivers a driving signal for a scan line; the GOA circuit further comprises a first pull-down control circuit, a second pull-down control circuit, a first pull-down switch, and a second pull-down switch; the first and second pull-down switches have their first terminals connected to the output terminal of the GOA circuit; the first pull-down switch has its control terminal connected to the first pull-down control circuit; the second pull-down switch has its control terminal connected to the second pull-down control circuit; the first and second pull-down switches have their second terminals connected to the reference voltage, wherein the node is still in a logic high level at the instant when the display panel is shutdown.

3. A driving method for a Gate Driver on Array (GOA) circuit of a display panel wherein the GOA circuit comprises a pull-up control circuit and a pull-up circuit, and a reference voltage is introduced to a node between the pull-up control circuit and the pull-up circuit, comprising the steps of:

providing a reset circuit whose input terminal is connected to the node; and connecting the reset circuit's output terminal to the reference voltage and, at the instant when the display panel is shutdown, applying a first activation signal to the control terminal of the reset circuit so as to bring down a node's level, wherein the first activation signal STV is applied for a shorter period than that of a second activation signal STV applied to the GOA circuit when the display panel normally displays an image, wherein an output terminal of the GOA circuit delivers a driving signal for a scan line; the GOA circuit further comprises a first pull-down control circuit, a second pull-down control circuit, a first pull-down switch, and a second pull-down switch; the first and second pull-down switches have their first terminals connected to the output terminal of the GOA circuit; the first pull-down switch has its control terminal connected to the first pull-down control circuit; the second pull-down switch has its control terminal connected to the second pull-down control circuit; the first and second pull-down switches have their second terminals connected to the reference voltage.

* * * * *